(12) United States Patent
Chang

(10) Patent No.: US 6,857,321 B2
(45) Date of Patent: Feb. 22, 2005

(54) PROXIMITY SENSOR SYSTEM HAVING A PROXIMITY SENSOR WITH A BIPOLAR SIGNAL OUTPUT

(75) Inventor: Keun-Ho Chang, Seoul (KR)

(73) Assignee: Hogahm Technology Co. Ltd., Taejon (KR)

( * ) Notice: Subject to any disclaimer, the term of this patent is extended or adjusted under 35 U.S.C. 154(b) by 0 days.

(21) Appl. No.: 10/469,220
(22) PCT Filed: Mar. 3, 2001
(86) PCT No.: PCT/KR01/00326
§ 371 (c)(1), (2), (4) Date: Aug. 27, 2003
(87) PCT Pub. No.: WO02/071020
PCT Pub. Date: Sep. 12, 2002

(65) Prior Publication Data
US 2004/0079172 A1 Apr. 29, 2004

(51) Int. Cl.⁷ ................................................. G01B 7/16
(52) U.S. Cl. ........................................................ 73/779
(58) Field of Search ............................. 73/779, 862.69; 324/207.11

(56) References Cited

U.S. PATENT DOCUMENTS

| | | | | |
|---|---|---|---|---|
| 4,652,819 A | * | 3/1987 | Kammerer | ............. 324/207.26 |
| 4,994,738 A | | 2/1991 | Soyck et al. | |
| 5,012,206 A | | 4/1991 | Tigges | |
| 5,352,979 A | * | 10/1994 | Conturo | ....................... 324/307 |
| 5,565,695 A | * | 10/1996 | Johnson | ....................... 257/295 |
| 5,629,540 A | * | 5/1997 | Roh et al. | .................... 257/306 |

FOREIGN PATENT DOCUMENTS

| | | |
|---|---|---|
| EP | 0751623 | 1/1998 |
| JP | 59196623 | 11/1984 |
| WO | WO 99/58943 | 11/1999 |

* cited by examiner

Primary Examiner—Max Noori
(74) Attorney, Agent, or Firm—Ohlandt, Greeley, Ruggiero & Perle, L.L.P.

(57) ABSTRACT

The present invention relates to a proximity sensor system comprising a sensor generating two types of pulse signals having opposite polarities in order to detect two different, small, metallic objects and to distinguish the objects. The proximity sensor system can involve at least two metallic objects to be detected having different magnetic properties; a sensor comprising a magnetic core having a plurality of legs and a toroidal coil winding fitted and supported onto at least one of the legs of the magnetic core; and an electronic circuit processing output signals from the sensor. The sensor generates predetermined signals having opposite polarities when metallic objects pass in proximity to the sensor. Suitable metallic objects include those made of ferromagnetic metal and diamagnetic or paramagnetic metal. The sensor generates a positive pulse signal when the ferromagnetic metallic object passes by the sensor, and the sensor generates a negative pulse signal when the diamagnetic or paramagnetic metallic object passes by the sensor.

4 Claims, 4 Drawing Sheets (a)

(b)

(c)

(a)

(b)

(a)

(b)

(c)

PROXIMITY SENSOR SYSTEM HAVING A PROXIMITY SENSOR WITH A BIPOLAR SIGNAL OUTPUT

CROSS REFERENCE TO RELATED APPLICATIONS

This patent application hereby claims priority to international patent application No. PCT/KR01/00326 having an international filing date of Mar. 3, 2001.

BACKGROUND OF THE INVENTION

1. Field of the Invention

The present invention relates to a sensor, and more particularly to a sensor system having a proximity sensor utilizing magnetic properties of metals.

2. Description of the Related Art

A proximity sensor detects an object when the object approaches within the detection boundary of the sensor. Detecting metallic objects is particularly useful in such applications as automation for assembly lines in a factory. In many instances, magnetic properties of metals are utilized as a principle for detection. There are many varieties of proximity sensors that utilize magnetic properties of metals.

In most proximity sensor applications, the objects to be detected are much larger than the proximity sensor, and the objects are easily detected because their magnetic couplings are strong. When the objects to be detected are small compared with the dimensions of the sensor, e.g. in a range of a few millimeters, the magnetic couplings are weak, and the detection of such objects is difficult. One application for detecting small objects is counting small teeth on a rapidly rotating gear in order to monitor the uniformity of the rotational speed of the gear. In such an application, special techniques need to be implemented such as making the sensors very small and limiting the detection boundaries of the sensors to be very short. In certain other applications, it may be necessary for one sensor to distinguish the objects as well as detect proximity. When the relative positions of two separate objects are critically important information, the capability of performing two functions with one sensor is advantageous and much more convenient.

SUMMARY OF THE INVENTION

The object of the invention is to provide a proximity sensor system comprising a sensor generating two types of pulse signals having opposite polarities in order to detect two different small, metallic objects and distinguish the objects.

Another object of the invention is to provide a proximity sensor system for measurement of torque output from an automobile clutch-disc.

The invention describes a technique by which two different metallic objects, for example a ferromagnetic object and a diamagnetic object, are separately and simultaneously detected by one sensor. The sensor of the present invention generates two signals having different polarities for two magnetically different metallic objects so that the sensor can distinguish the different metallic objects.

According to one aspect of the invention, there is provided a proximity sensor system comprising at least two metallic objects to be detected having different magnetic properties from each other, a sensor comprising a magnetic core having a plurality of legs and a toroidal coil winding being fitted and supported onto at least one of the legs of the magnetic core, and an electronic circuit processing output signals from the sensor. The sensor generates predetermined signals having opposite polarities when the metallic objects pass by in proximity to the sensor.

Preferably, the metallic objects include a metallic object made of ferromagnetic metal and a metallic object made of diamagnetic or paramagnetic metal.

Preferably, the sensor generates a positive pulse signal when the ferromagnetic metallic object passes by the sensor, and the sensor generates a negative pulse signal when the diamagnetic or paramagnetic metallic object passes by the sensor.

Preferably, the electronic circuit further comprises an oscillator to provide the sensor with an alternating current, and comprises a half-wave rectifier to process output signals from the sensor, a low-pass filter and an amplifier.

According to another aspect of the invention, there is provided a proximity sensor system for a device for real time measurement of torque output from an engine to a transmission of an automobile comprising a plate type clutch with a clutch plate, a clutch shaft for connecting the clutch plate to a transmission, and an axle guide tube for surrounding the clutch shaft over a length of the clutch shaft. The clutch plate comprises an intermediate body member with a hub attached at a central portion thereof, and low and upper body members being adapted to be positioned onto lower and upper surfaces of the intermediate body member respectively. The lower and upper body members are formed with central apertures penetrated by the hub and are circumferentially displaceable relative to the intermediate body member by a damper spring means. The proximity sensor system comprises a first plurality of axially extending posts formed equidistantly around a periphery of upper portion of the hub and made of a metal having a predetermined magnetic property, a second plurality of axially extending posts formed equidistantly around a circumference of the central aperture of the upper body member and made of a metal having a magnetic property different from the first posts, a sensor comprising a magnetic core having a plurality of legs and a toroidal coil winding, fitted and supported onto at least one of the legs of the magnetic core, and an electronic circuit processing output signals from the sensor. The second posts are disposed radially outside the first posts. The sensor is positioned radially inside the first and second posts, and disposed onto the tip portion of the axle guide tube to face the first and second posts. The sensor generates predetermined signals having different polarities when the first and second posts pass by the sensor respectively.

DESCRIPTION OF THE FIGURES

FIG. 2 is a schematic view showing magnetic flux from a sensor, wherein FIG. 2(a) is a view showing a state with no objects to be detected, FIG. 2(b) is a view showing detection of a ferromagnetic object, and FIG. 2(c) is a view showing detection of a diamagnetic object.

DETAILED DESCRIPTION OF THE INVENTION

The present invention is embodied as a proximity sensor system, wherein a proximity sensor operates in conjunction with specific objects to be detected and generates pulses when the objects pass by in proximity to the sensor. The proximity sensor system of the invention has at least three aspects, a sensor, objects to be detected and an electronic circuit.

Figure 1:
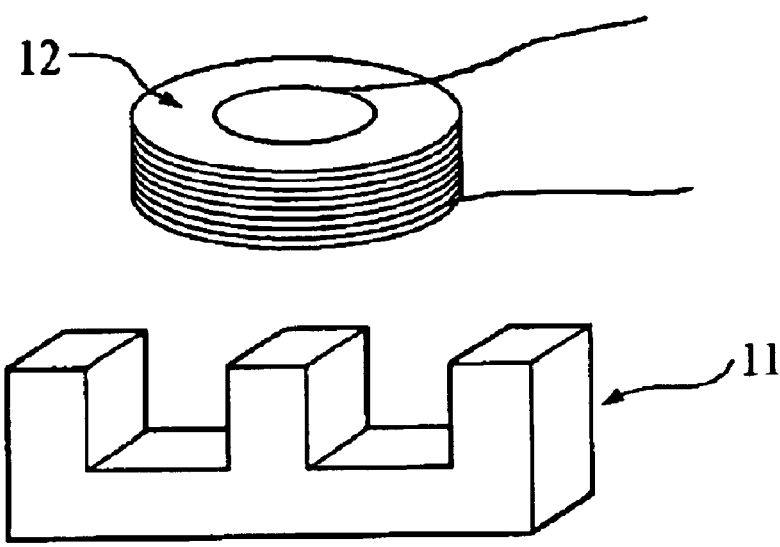
FIGS. 1(a) and 1(b) are elevated perspective views showing non-assembled and assembled states of a sensor according to the present invention, respectively.
Figure 1:
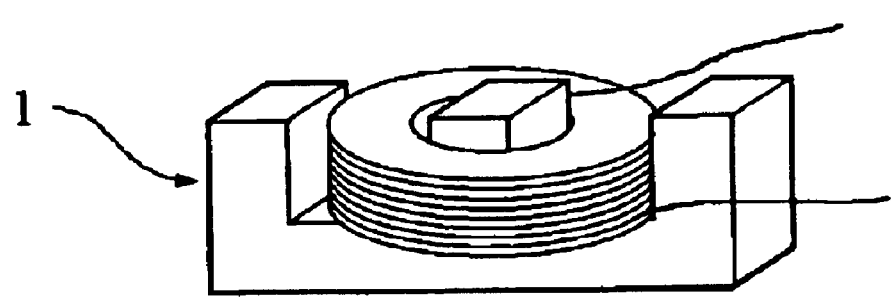

As shown in FIGS. 1(a) and (b), a sensor 1 includes a magnetic core 11 and a toroidal coil winding 12. The magnetic core 11 can be made in the shape of an "E" or in the shape of a two-leg "⊂," and the coil winding 12 is supported by fitting a central portion thereof onto at least one protruding leg of the magnetic core 11. In the embodiment shown in FIGS. 1(a) and 1(b), the magnetic core 11 is made in the shape of an "E," and the coil winding 12 is supported by fitting a central portion thereof onto the center-leg of the three protruding legs.

Figure 2:
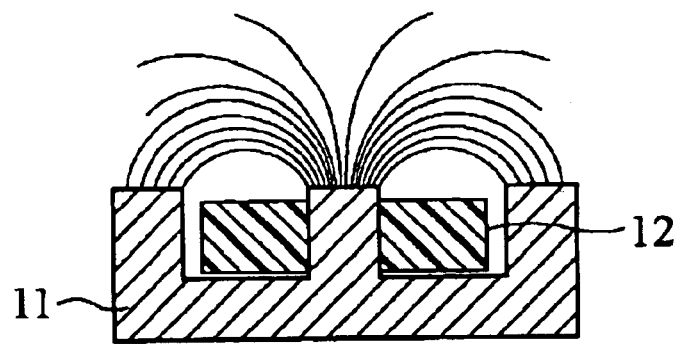
Figure 2:
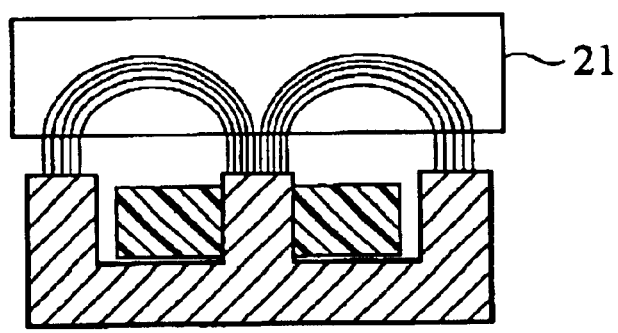
Figure 2:
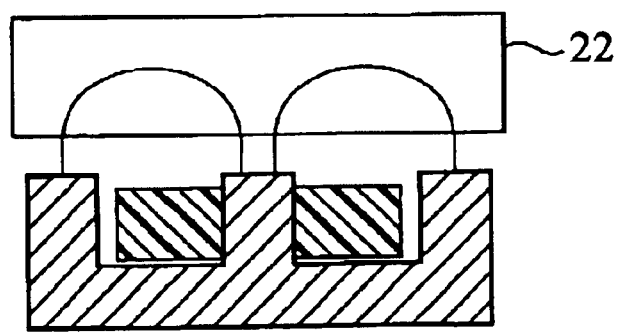

When an alternating current passes the coil winding 12, the sensor 1 produces a magnetic flux as represented in FIG. 2(a). When a ferromagnetic object 21 approaches the vicinity of the sensor, the magnetic flux is strengthened as shown in FIG. 2(b). However, if a diamagnetic object 22 approaches the vicinity of the sensor, the magnetic flux is weakened as shown in FIG. 2(c).

Sensor 1 generates two types of pulse signals having opposite polarities depending upon the properties of the objects to be detected, thus enabling the sensor system to distinguish two different types of objects. For example, if one of the two type objects is made of ferromagnetic metal, such as iron, nickel or their alloys, and the other object is made of diamagnetic (or paramagnetic) metal, such as copper or aluminum, the sensor 1 generates a positive (+) pulse signal when a ferromagnetic metallic object passes sensor 1, and it generates a negative (−) pulse signal when a diamagnetic (or paramagnetic) metallic object passes sensor 1.

Figure 3:
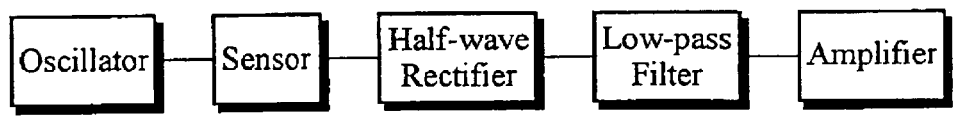
FIG. 3 is a block diagram of an electronic circuit used in a system of the present invention.

FIG. 3 shows a block diagram of an example for an electronic circuit used in the proximity sensor system of the present invention. The electronic circuit includes an oscillator to provide the sensor with an alternating current, a half-wave rectifier to process output signals from the sensor, a low-pass filter and an amplifier.

Figure 4:
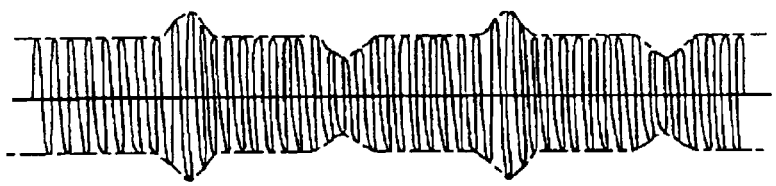
FIG. 4 shows modulated carrier signals.
Figure 5:
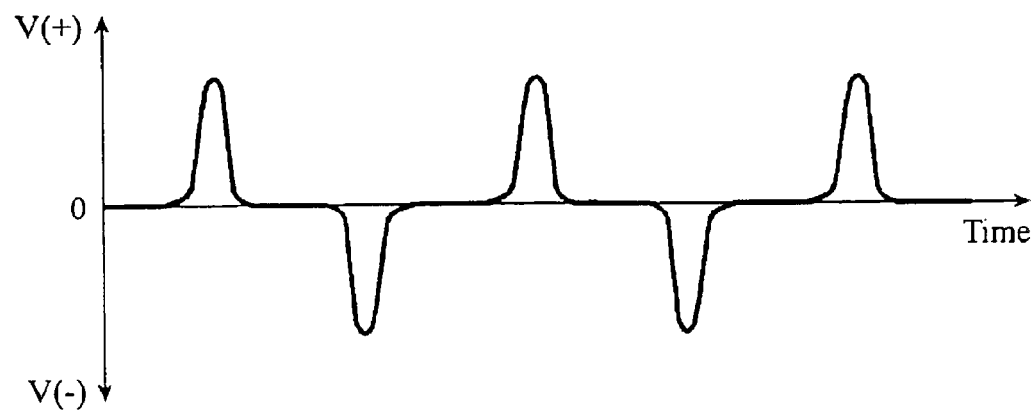
FIG. 5 shows demodulated pulse signals.

The alternating current that flows in the coil winding 12 of the sensor 1 is supplied by the oscillator, which generates high frequency alternating currents. The coil winding 12 acts as an inductive load to the oscillator. When the objects to be detected approach the sensor, a magnetic flux is modified as shown in FIGS. 2(b) and 2(c), thereby modifying impedance of the inductive load so that output voltage signals are modulated as shown in FIG. 4. The modulated carrier signals pass through the half-wave rectifier and the low-pass filter to produce demodulated output pulse signals, as shown in FIG. 5.

According to the proximity sensor system of the present invention, the sensor generates pulse signals having different polarities depending on the magnetic properties of the objects approaching the sensor, thus enabling the sensor system to provide two types of information with one sensor. One possible form of information is whether a certain type metallic object is approaching the sensor, while the other is about another type of metallic object approaching the sensor.

In the foregoing embodiment, it has been stated that the sensor generates a positive pulse signal for the ferromagnetic object, and a negative pulse signal for the diamagnetic (or paramagnetic) object. However, it should be noted that the polarities of the pulse signals are interchangeable depending on processing of the signals in the electronic circuit.

According to the construction of the sensor system of the present invention, as the sensor generates two pulse signals having different polarities depending upon the types of objects to be detected, the objects can be easily detected and distinguished, thus improving the reliability of detecting and distinguishing the objects, even in the case of small objects.

Although the proximity sensor system of the invention has been described and illustrated for a specific embodiment, the invention is not intended to be limited to the embodiment, and may be modified or varied with regard to construction, without departing from the spirit and principles disclosed in the claims below.

INDUSTRIAL APPLICABILITY

The proximity sensor system of the present invention can be applied to various fields, for example, a device for real time measurement of torque from an automobile engine such disclosed in International Application Publication No. WO 99/58943.

Figure 6:
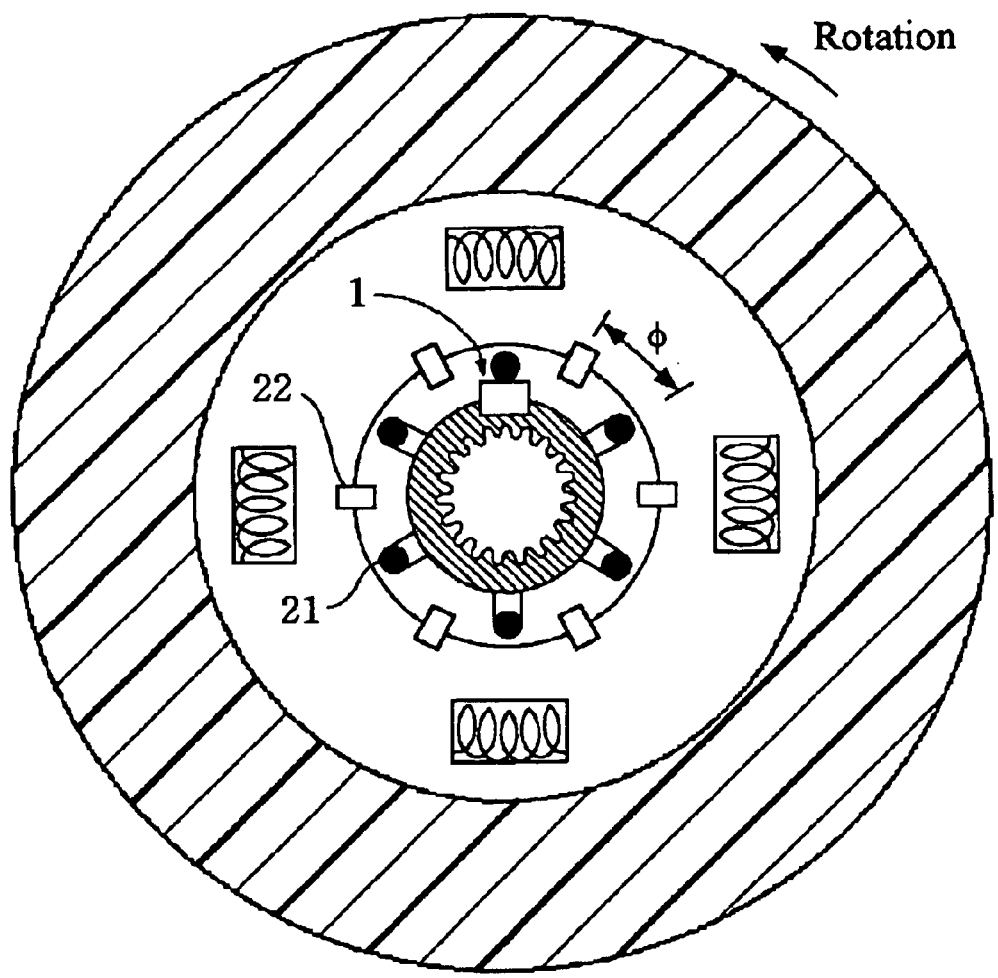
FIG. 6 shows an example of the proximity sensor system according to the present invention applied to a clutch-disc torque measurement sensor system for an automobile.

In the device for real time measurement of torque from an automobile engine, a planar clutch plate that is a component of an automobile equipped with a manual transmission, can be slightly modified by incorporating two types of metallic posts having different magnetic properties corresponding to the metallic objects as described in the present invention. As shown in FIG. 6, one type of metallic posts 21 is welded on a hub of the clutch plate, and the other type of metallic posts 22 is welded on the clutch plate. The sensor 1 is mounted onto mounding hole of a clutch axle guide tube (not shown in FIG. 6) placed radially inside the metallic posts. When the automobile is in motion, the clutch plate rotates, but the sensor mounted on the axle guide tube remains stationary. Thus, the metallic posts pass-by in proximity of the sensor. The sensor detects the types of metallic posts and generates pulse signals having opposite polarities.

Through generated pulse signals having opposite polarities, the relative angular displacements of the two types of posts 21, 22 during rotation of the clutch plate, can be easily detected and distinguished, thus improving reliability and accuracy of real time measurement of torque from an engine.

What is claimed is:

1. A proximity sensor system comprising:
   a ferromagnetic metallic object for being detected;
   a diamagnetic metallic object for being detected;
   a sensor for generating a positive pulse signal, said positive pulse signal being generated when said ferromagnetic metallic object passes by said sensor, said sensor generating a negative pulse signal when said diamagnetic metallic object passes by said sensor, said sensor further comprising a magnetic core having a plurality of legs and a toroidal coil being fitted and supported onto at least one of said plurality of legs; and
   an electronic circuit for processing an output signal from said sensor.

2. The proximity sensor system of claim 1, wherein the proximity sensor system further comprises an oscillator for providing said sensor with an alternating current, and wherein said electronic circuit comprises a half-wave rectifier for processing said output signal from said sensor, a low-pass filter, and an amplifier.

3. A proximity sensor system for real time measurement of torque from an engine to a transmission of an automobile having a plate type clutch with a clutch plate, a clutch shaft for connecting the clutch plate to the transmission, and an axle guide tube for surrounding a length of the clutch shaft, the clutch plate comprising:

- an intermediate body member with a hub being connected at a central portion thereof, a lower body member, and an upper body member positioned onto a lower surface and an upper surface of said intermediate body member respectively, said lower body member and said upper body member being formed with a plurality of central apertures, said plurality of central apertures being penetrated by said hub and being circumferentially displaceable relative to said intermediate body member by a damper spring means, the proximity sensor system comprising:
- a first plurality of axially extended posts being made of a ferromagnetic metal, said first plurality of axially extended posts being formed equidistantly around a periphery of an upper portion of said hub;
- a second plurality of axially extended posts being made of a diamagnetic metal, said second plurality of axially extended posts being formed equidistantly around a circumference of at least one of said plurality of central apertures of said upper body member;
- a sensor for generating a positive pulse signal when said first plurality of axially extended posts passes by said sensor, wherein said sensor generates a negative pulse signal when said second plurality of axially extended posts passes by said sensor, said sensor having a magnetic core having a plurality of legs and a toroidal coil windingly fitted and supported onto at least one of said plurality of legs, said sensor being positioned radially in said first plurality of axially extended posts, and said second plurality of axially extended posts and being disposed onto a tip portion of an axle guide tube to face said first plurality of axially extended posts and said second plurality of axially extended posts; and
- an electronic circuit for processing an output signal from said sensor.

4. A proximity sensor system comprising:

- a ferromagnetic metallic object for being detected;
- a paramagnetic metallic object for being detected;
- a sensor for generating a positive pulse signal when said ferromagnetic metallic object passes said sensor, said sensor for generating a negative pulse signal when said paramagnetic metallic object passes said sensor, said sensor having a magnetic core with a plurality of legs and a toroidal coil windingly fitted and supported onto at least one of said plurality of legs; and
- an electronic circuit for processing output signals from said sensor.

* * * * *